United States Patent
Goto et al.

(10) Patent No.: US 9,211,570 B2
(45) Date of Patent: Dec. 15, 2015

(54) ION BOMBARDMENT TREATMENT APPARATUS AND METHOD FOR CLEANING OF SURFACE OF BASE MATERIAL USING THE SAME

(75) Inventors: Naoyuki Goto, Takasago (JP); Homare Nomura, Takasago (JP); Shigeto Adachi, Takasago (JP); Koumei Fujioka, Takasago (JP)

(73) Assignee: Kobe Steel, Ltd., Kobe-shi (JP)

( * ) Notice: Subject to any disclaimer, the term of this patent is extended or adjusted under 35 U.S.C. 154(b) by 480 days.

(21) Appl. No.: 13/697,710

(22) PCT Filed: May 16, 2011

(86) PCT No.: PCT/JP2011/002691
§ 371 (c)(1),
(2), (4) Date: Nov. 13, 2012

(87) PCT Pub. No.: WO2011/151979
PCT Pub. Date: Dec. 8, 2011

(65) Prior Publication Data
US 2013/0061872 A1    Mar. 14, 2013

(30) Foreign Application Priority Data
Jun. 1, 2010   (JP) .................................. 2010-125830

(51) Int. Cl.
*B08B 7/00* (2006.01)
*C23C 14/02* (2006.01)
*C23C 14/32* (2006.01)
*H01J 37/32* (2006.01)

(52) U.S. Cl.
CPC ............. *B08B 7/0071* (2013.01); *C23C 14/022* (2013.01); *C23C 14/32* (2013.01); *H01J 37/32018* (2013.01); *H01J 37/32027* (2013.01); *H01J 37/32669* (2013.01); *H01J 37/32853* (2013.01); *H01J 37/32862* (2013.01)

(58) Field of Classification Search
CPC .................. H01J 37/32669; H01J 37/32853; H01J 37/32862; H01J 37/32027; H01J 37/32055; H01J 37/32431; H01J 37/32403; H01J 37/32018; C23C 14/564; C23C 16/029; C23C 16/4407; C23C 28/42; C23C 28/049; C23C 28/044; C23C 28/048; C23C 28/046; B08B 7/00; B08B 7/0007; B08B 7/0035; B08B 7/13
USPC ....................................... 134/1.1; 156/345.37
See application file for complete search history.

(56) References Cited

U.S. PATENT DOCUMENTS 3,654,108 A * 4/1972 Smith, Jr. ...................... 204/164
3,661,747 A * 5/1972 Byrnes et al. ............. 204/192.23
(Continued)

FOREIGN PATENT DOCUMENTS

JP      2002-371351      12/2002
JP      4208258          1/2009

OTHER PUBLICATIONS

U.S. Appl. No. 13/666,038, filed Nov. 1, 2012, Hirota, et al.
(Continued)

*Primary Examiner* — Saeed T Chaudhry
(74) *Attorney, Agent, or Firm* — Oblon, McClelland, Maier & Neustadt, L.L.P.

(57) ABSTRACT

In an ion bombardment treatment apparatus (1A) and a cleaning method, base materials (W) to be treated are held by a work table (11) so as to be placed between a filament (3) and an anode (4) in a vacuum chamber (2), and a discharge power supply (5) which can generate a glow discharge upon the application of a potential difference between the filament (3) and the anode (4) is insulated from the vacuum chamber (2). In the ion bombardment treatment apparatus (1A) and the cleaning method, the efficiency of the cleaning of a base material can be improved and a power supply can be controlled stably.

12 Claims, 5 Drawing Sheets

(56) References Cited

U.S. PATENT DOCUMENTS

| | | | |
|---|---|---|---|
| 5,294,322 | A | 3/1994 | Vetter et al. |
| 5,709,784 | A | 1/1998 | Braendle et al. |
| 6,740,393 | B1 | 5/2004 | Massler et al. |
| 2004/0038033 | A1* | 2/2004 | Massler et al. ............ 428/408 |
| 2004/0219294 | A1 | 11/2004 | Massler et al. |
| 2008/0311310 | A1 | 12/2008 | Massler et al. |
| 2010/0018464 | A1 | 1/2010 | Massler et al. |

OTHER PUBLICATIONS

Extended European Search Report issued Sep. 13, 2013, in European Patent Application No. 11789394.1.

* cited by examiner

ION BOMBARDMENT TREATMENT APPARATUS AND METHOD FOR CLEANING OF SURFACE OF BASE MATERIAL USING THE SAME

TECHNICAL FIELD

The present invention relates to an ion bombardment treatment apparatus capable of cleaning a surface of a base material as a pre-treatment of film formation, and a method for cleaning of the surface of the base material using this treatment apparatus.

BACKGROUND ART

Conventionally, for the purpose of improving abrasion resistance of a cutting tool and improving a sliding characteristic of a sliding surface of a mechanical part, a hard film (of for example TiN, TiAlN, CrN, or the like) is formed on a base material (film formation object) by the physical vapor deposition (PVD) method. An apparatus used for forming such a hard film includes for example a physical vapor deposition apparatus such as an arc ion plating apparatus and a sputtering apparatus.

In such a physical vapor deposition apparatus, in order to improve adhesion of the film to be formed, it is known that a surface of the base material is purified (cleaned) before forming the film. This pre-treatment includes heating cleaning with electron bombardment and a method for cleaning by generating heavy inert gas ions such as argon ions with plasma discharge and irradiating the inert gas ions from this plasma to the base material so as to heat the surface (ion bombardment treatment method).

As a technique for performing the pre-treatment of the film formation described above, Patent Document 1 describes an apparatus for cleaning a surface or heating a base material before film formation. In this apparatus, an arc evaporation source including a shutter openable and closable relative to the base material, and an anode independent from this arc evaporation source in a chamber. An inert gas such as an argon gas is introduced into the chamber, argon ions are generated by utilizing arc discharge caused between the arc evaporation source whose front surface is covered by the shutter and the chamber, and the argon ions are irradiated to the surface of the base material having negative potential by applying potential between the anode and the base material. Thereby, in the apparatus disclosed in Patent Document 1, the surface of the base material is cleaned.

Patent Document 2 discloses a technique of cleaning a surface of a base material by forming arc discharge (plasma supply source) in a space vertically ranging over treatment height of the base material or not less than this treatment height on the inner circumferential side or the outer circumferential side of the base material placed around a vertically center axis in a vacuum chamber, and irradiating argon ions generated therein to the base material to which negative bias voltage is applied.

However, in the above apparatus of Patent Document 1, a temperature of the shutter for covering the front surface of the arc evaporation source becomes high, and a temperature of the base material also becomes high upon receiving radiation heat thereof. Thus, this apparatus disclosed in Patent Document 1 is not easily applied to a base material requiring a treatment at a low temperature such as a quenching material. Since droplets from the arc evaporation source are attached to the shutter, frequent maintenance is required. Further, since the evaporation source cannot be completely covered by the shutter, there is a fear that some droplets are attached to the base material. Further, this apparatus disclosed in Patent Document 1 is the technique substantially using a titanium target. However, since the apparatus requires a too large space as a mechanism for only cleaning by the ion bombardment treatment, cost thereof is high.

Meanwhile, the apparatus disclosed in Patent Document 2 is to charge a gas into a negative electrode chamber separately provided in an upper part of the vacuum chamber so as to generate a pressure difference (pressure gradient) between inner pressure of the negative electrode chamber and inner pressure of the vacuum chamber, and by utilizing this pressure gradient, swiftly jet the gas in the negative electrode chamber into the vacuum chamber from a small opening, so as to generate plasma along the vertically center axis.

However, it is essential to charge the gas into the negative electrode chamber at predetermined pressure in order to generate the pressure gradient. There is a need for severely adjusting a diameter of the small opening in order to swiftly jet the gas into the vacuum chamber. Since a peripheral part of the small opening formed of expensive molybdenum or the like is always exposed to gas jet, the peripheral part is harshly worn away. Thus, an economical burden is increased. In order to evenly clean the surface of the base material, an increase in size of the apparatus is unavoidable, and a plurality of positive electrodes is placed, so that a system is complicated. Thus, a distance between the surface of the base material and the plasma (that is, a cleaning effect) is not easily maintained constantly.

In addition, there are not only the disadvantageous points for cleaning described above but also unpreferable points for a circuit in these apparatuses (apparatus described in Patent Document 1 in particular). That is, in the apparatus described in Patent Document 1, all the power supplies are connected via the vacuum chamber. Thus, the power supplies form a loop via the chamber. When such a loop is formed, current control is instabilized in a case where GNDs (grounds) actually have different potential from each other or the like.

CITATION LIST

Patent Document

Patent Document 1: U.S. Pat. No. 5,294,322
Patent Document 2: Japanese Patent No. 4208258 (WO1997/034315)

SUMMARY OF INVENTION

The present invention is an invention achieved in consideration with the above situation, and an object thereof is to provide an ion bombardment treatment apparatus capable of enhancing a cleaning effect of a base material and stabilizing control of power supplies, and a method for cleaning of a surface of the base material using this treatment apparatus.

In the ion bombardment treatment apparatus and the method for cleaning according to the present invention, a base material to be treated is held by a base material holding tool in such a manner that the base material is placed between a thermal electron emission electrode and an anode in a vacuum chamber, and a discharge power supply for generating a glow discharge upon application of a potential difference between the thermal electron emission electrode and the anode is insulated from the vacuum chamber. Therefore, the ion bombardment treatment apparatus and the method for cleaning can enhance the cleaning effect of the base material and stabilize the control of the power supplies.

The above and other objects, characteristics, and advantages of the present invention will be clarified from the detailed description below and the attached drawings.

DESCRIPTION OF EMBODIMENTS

Figure 1:
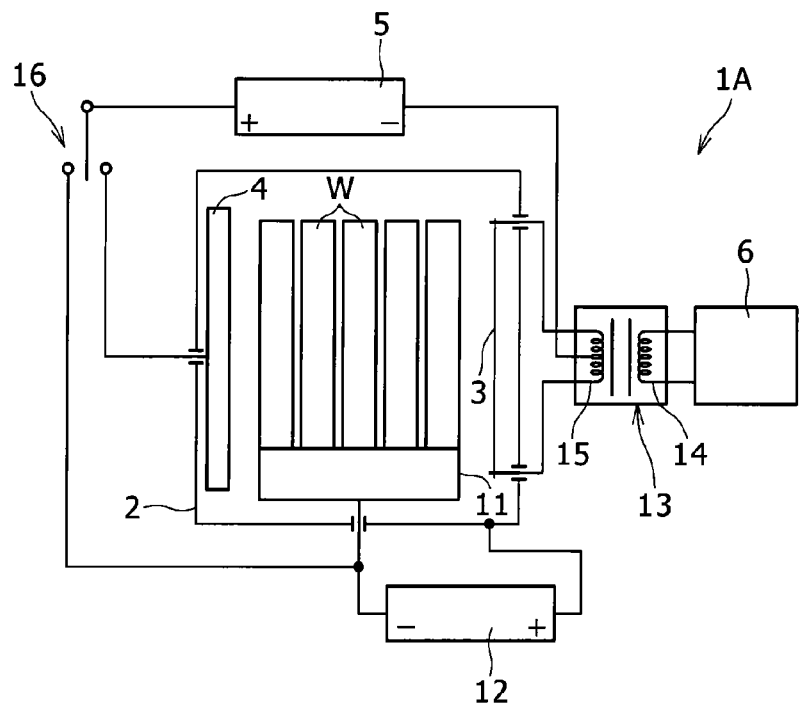
FIG. 1 A schematic view showing an ion bombardment apparatus according to a first embodiment.

Hereinafter, one mode of the present invention will be described based on the drawings. It should be noted that configurations given the same reference numerals in the figures are the same configurations, and description thereof will be appropriately omitted. In the present specification, in a case where several configurations are collectively named, the configurations are denoted by a reference numeral without any alphabetical index. In a case where the configurations are individually named, reference numerals with alphabetical indexes are used.

First Embodiment

Figure 2:
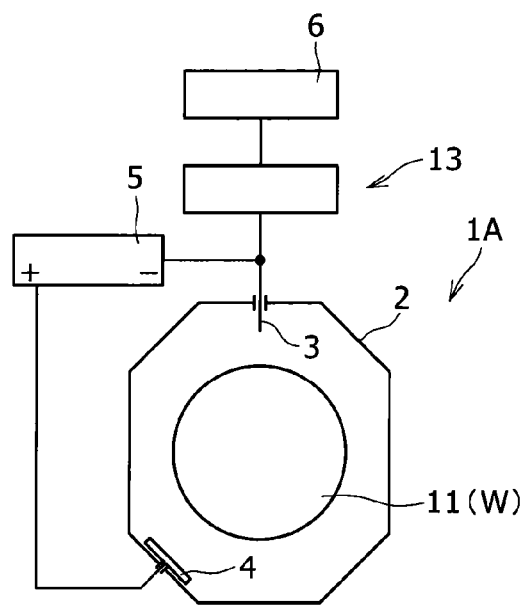
FIG. 2 A schematic view showing the planar direction of the ion bombardment apparatus shown in FIG. 1.

FIGS. 1 and 2 show an ion bombardment apparatus 1A according to a first embodiment. This ion bombardment treatment apparatus 1A is an apparatus for coating surfaces of base materials W installed in a vacuum chamber 2 having an octagonal section with a film by the PVD (physical vapor deposition) method. In substantially center of a bottom surface in the vacuum chamber 2 in this ion bombardment treatment apparatus 1A, a rotation type base material holding tool (work table) 11 for mounting the plurality of base materials W serving as treatment objects is provided. The vacuum chamber 2 has a heating type thermal electron emission electrode 3 (filament 3) placed on one side surface inside thereof, and an anode 4 placed on another side surface inside thereof.

It should be noted that as shown in FIGS. 1 and 2, the base materials W and the work table 11 supporting the base materials are placed between the filament 3 and the anode 4. The base materials W are supported by the work table 11 in a standing state (so that the longitudinal direction of the base materials W is set along the up and down direction). In addition, the ion bombardment treatment apparatus 1A has a discharge power supply 5 for generating plasma discharge upon application of a potential difference between the filament 3 and the anode 4, and a heating power supply 6 for heating the filament 3. Further, the ion bombardment treatment apparatus also has a bias power supply 12 connected to the work table 11 for applying negative voltage to the base materials W.

A gas introduction port for introducing an inert gas such as argon into the vacuum chamber 2, and a gas discharge port for discharging the inert gas from the vacuum chamber 2 are provided in the vacuum chamber 2 (both the gas introduction and discharge ports are not shown in the figures). The filament 3 serving as the thermal electron emission electrode is a linear member for irradiating thermal electrons when heated, and is formed of metal such as tungsten (W). The filament 3 is placed on the substantially opposite side of the anode 4 across the base materials W (refer to FIG. 2). In a case of this embodiment, the filament 3 is placed on one side surface of an octagon, and the anode 4 is placed on a surface adjacent to a surface facing the one side surface.

As shown in FIG. 1, the filament 3 is placed on an inner wall of the vacuum chamber 2 along the height direction (the up and down direction or the longitudinal direction of the base materials W in a standing state) via an insulating body (FIGS. 1 and 2 express an insulating state by a gap provided between the filament and the vacuum chamber 2). Both ends thereof are connected to the filament heating power supply 6 described later. However, this filament heating power supply 6 and the filament 3 are not directly connected but connected via an insulating transformer 13 in an electrically insulated state.

With this configuration, an AC current outputted from the heating power supply 6 flows through the filament 3 via the insulating transformer 13. The filament 3 is heated by flow of the current, so that the thermal electrons pop out from the filament 3. It should be noted that on the primary coil 14 side of the insulating transformer 13, a power conditioner or the like (not shown) for controlling a phase of the AC current from the heating power supply 6 is assembled.

Length of the filament 3 is set to be the same or slightly longer than height of the standing base materials W (hereinafter, referred to as the treatment height of the base materials W). The filament 3 is placed at a position overlapping with (position overlying) the base materials W in a side view. Thickness and composition of the filament 3 are uniform over the longitudinal direction thereof. Therefore, the thermal electrons popping out from this filament 3 are substantially uniform over the treatment height direction of the base materials W. Thus, an amount of the thermal electrons emitted to the base material W side is controlled by potential at a point in the filament 3.

It should be noted that the popping thermal electrons are collided with the argon gas introduced into the vacuum chamber 2 so as to generate argon ions or directly irradiated to the base materials W by a switching circuit 16 described later. Positive potential (relatively higher potential than the filament 3) is applied to the anode (positive electrode) 4, and the anode is placed on an inner wall surface of the vacuum chamber 2 at a position facing the filament 3 across the base materials W. The anode 4 is also not electrically connected to the vacuum chamber 2 but attached via an insulating body.

As shown in FIG. 1, the discharge power supply 5 is a DC power supply for generating the discharge upon the application of the potential difference between the filament 3 and the anode 4. A positive side output thereof is connected to the anode 4, and a negative side output thereof is connected to the filament 3 via the insulating transformer 13. More specifically, the negative side output of the discharge power supply 5 is connected to a center tap provided in an intermediate part in the winding core direction of a secondary coil 15, and connected to the filament 3 through the secondary coil 15 (refer to FIG. 1).

Meanwhile, as described above, the heating power supply 6 is an AC power supply for letting the current flow through and heating the filament 3 so as to irradiate the thermal electrons to the base materials W. Outputs of terminals are connected to both the ends of the filament 3 via the insulating transformer 13. With such a configuration, the discharge power supply 5 and the heating power supply 6 are not connected to each other (for example, not connected to the same GND or the like), and at the same time, not connected to the vacuum chamber 2, so that electric independence between the discharge power supply 5 and the heating power supply 6 and electric independence of the discharge power supply 5 and the heating power supply 6 from the vacuum chamber 2 are maintained.

Meanwhile, the bias power supply 12 is a DC power supply for applying negative charge relative to the vacuum chamber 2 to the base materials W. A positive side output thereof is connected to the vacuum chamber 2, and a negative side output thereof is connected to the base materials W via the work table 11. With this configuration, the bias power supply 12 is not connected to the discharge power supply 5 and the heating power supply 6 described above (for example, not connected to the same GND or the like), so that the three power supplies 5, 6, 12 are electrically independent from each other.

Therefore, the power supplies 5, 6, 12 do not form a loop via the vacuum chamber 2 or a common ground. Even when GNDs actually have different potential from each other, current control of the power supplies can be stably performed. It should be noted that the bias power supply 12 is set so as to apply negative voltage of 10 to 1,000 V to the base materials W.

As shown in FIG. 1, the ion bombardment treatment apparatus 1A according to the first embodiment is provided with the switching circuit 16 capable of switching the positive side output of the discharge power supply 5 between connection to the anode 4 and connection to the base materials W. Therefore, in a case where the positive side output of the discharge power supply 5 is connected to the base materials W, the base materials W have higher potential (positive potential) than the filament 3 by the discharge power supply 5. Thus, the ion bombardment treatment apparatus can also be used for electron heating use of irradiating the thermal electrons emitted from the filament 3 to the base materials W so as to heat the base materials W.

Hereinafter, a use mode of the ion bombardment treatment apparatus 1A according to the first embodiment, that is, a method for cleaning of the base materials W before physical vapor deposition will be described. Firstly, the base materials W are fixed to the work table 11 in the vacuum chamber 2, and a heating treatment and the like are performed in the evacuated chamber 2. After a temperature of the base materials W is controlled to be a temperature for cleaning (temperature suitable for cleaning the surfaces), the argon gas is introduced into the vacuum chamber 2. The argon gas may be introduced at the same time as evacuation.

Under an argon gas atmosphere, an output of the discharge power supply 5 is turned on by current control with about 10 to 30 A setting, and in a state that a potential difference of about 100 V or more is applied between the filament 3 and the anode 4, an AC current flows from the heating power supply 6. Thereby, at the time of moving the thermal electrons generated from the filament 3 by the heating power supply 6 in the direction of the anode 4 having relatively positive potential, the argon gas in the vicinity of the base materials W is ionized and brought into a plasma state. Thus, a glow discharge state is generated, and the argon ions are generated in the vicinity of the base materials W.

In this case, a phase of the AC current by the power conditioner of the insulating transformer 13 and the argon gas to be suctioned into and discharged from the vacuum chamber 2 are controlled at the same time, so that a value of the current flowing through the filament 3 and gas pressure of the argon gas atmosphere around the base materials W are controlled to be in a glow-dischargeable state between the filament 3 and the anode 4. After this process, in a state that plasma is generated around the base materials W, the bias power supply 12 is started up, negative bias voltage is applied to the base materials W, and the argon ions having positive charge are irradiated to the base materials W (bombardment), so that the surfaces of the base materials W are cleaned.

It should be noted that although only the mechanism for performing the ion bombardment treatment is described in the first embodiment described above, the ion bombardment treatment apparatus 1A may be formed in such a manner that an arc evaporation source attached toward the base materials W is also provided in the vacuum chamber 2 and film formation by the physical vapor deposition can also be performed in the same vacuum chamber 2.

Figure 8:
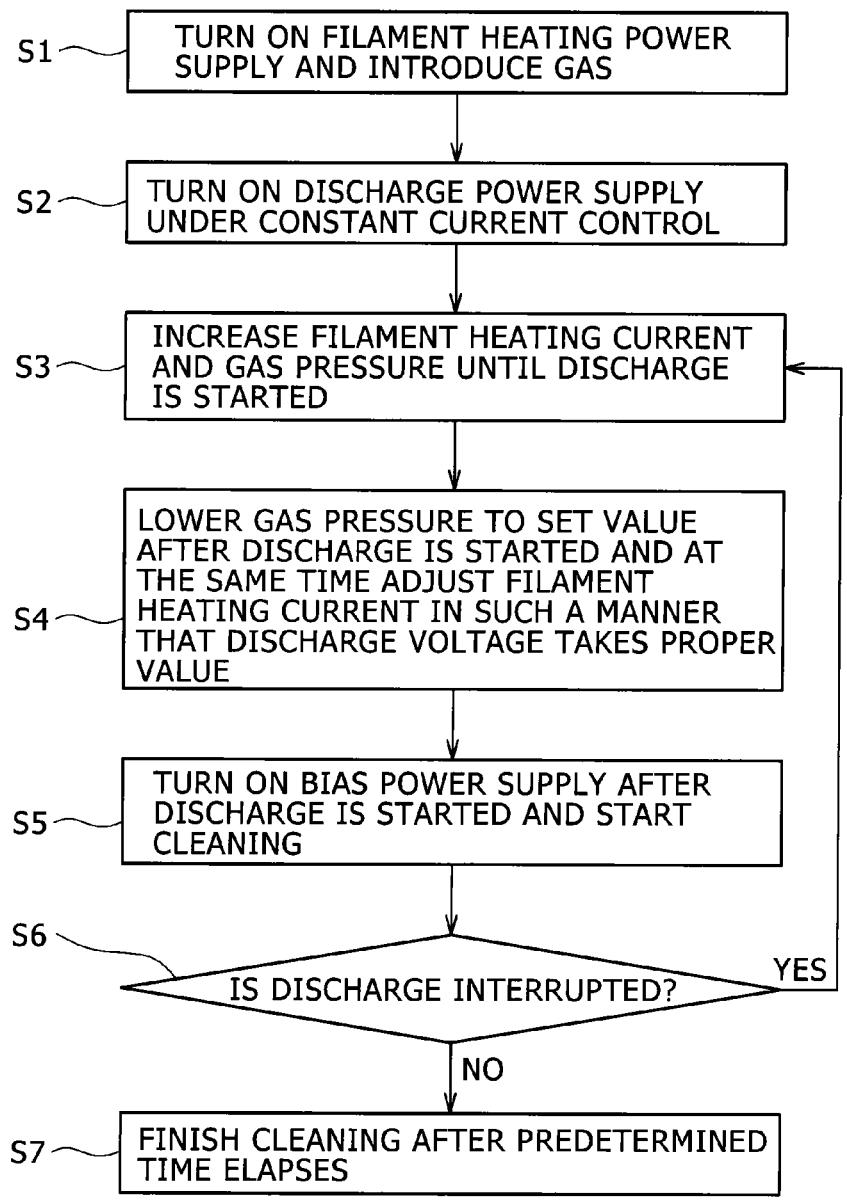
FIG. 8 A flowchart showing a method for cleaning according to the embodiments.

Next, a detail of this method for cleaning will be described below. Firstly, as shown in a flowchart of FIG. 8, in Step S1, at the same time as activation of the heating power supply 6 and start of heating of the filament 3, the argon gas is introduced into the vacuum chamber 2.

Successively, in Step S2, the discharge power supply 5 is activated and the voltage is applied between the filament 3 and the anode 4. At this time, the current flowing between the filament 3 and the anode 4 is controlled to be a constant current.

Successively, in Step S3, the heating current flowing through the filament 3 and the gas pressure of the argon gas in the vacuum chamber 2 are increased so that the glow discharge is started between the filament 3 and the anode 4.

It should be noted that by increasing the heating current and the argon gas pressure, the glow discharge is easily generated. By this discharge, plasma is generated around the base materials W, so that the argon ions having positive charge are generated.

Successively, in Step S4, after start of the discharge, the gas pressure in the vacuum chamber 2 is lowered to a set value with which this discharge is sustainable, and at the same time, the filament heating current is adjusted so that the discharge voltage takes a proper value.

Successively, in Step S5, after the glow discharge is started, the bias power supply 12 is activated, and the negative potential is applied to the base materials W, so that the argon ions having positive charge are irradiated to the surfaces of the base materials W and the cleaning is started. During this cleaning operation, whether or not the discharge is interrupted is monitored. In a case where the discharge is interrupted in Step S6 (Yes), the treatment is returned to Step S3. Meanwhile, in a case where the discharge is continued and the cleaning operation is finished (No), a treatment of Step S7 is executed.

When it is determined that a predetermined time elapses from start of the cleaning in this Step S7, the power supplies are turned off in order to finish the cleaning of the surfaces of the base materials W. As described above, at the time of cleaning the base materials W, until the glow discharge is started between the filament 3 and the anode 4, the heating current flowing through the filament 3 and the gas pressure of the argon gas in the vacuum chamber 2 are increased. After the start of the discharge, the heating current and the gas pressure are lowered to the values with which the discharge is sustainable. Thus, a high-voltage power supply is not required as the discharge power supply 5, so that an occupied space and cost can be suppressed.

The treatment described above is realized by a program in a control portion (not shown) provided in the ion bombardment treatment apparatus 1A. This control portion controls the power supplies 5, 6, 12 and the argon gas pressure in accordance with the program. By adopting the ion bombardment treatment apparatus 1A and the method for cleaning before film formation using this apparatus 1A described above, the thermal electrons can be irradiated to the base materials W uniformly in the height direction, so that the base materials W can be uniformly cleaned. By wiring the discharge power supply 5 and the heating power supply 6 independently from the vacuum chamber 2, the current control of the power supplies is stabilized.

Figure 3:
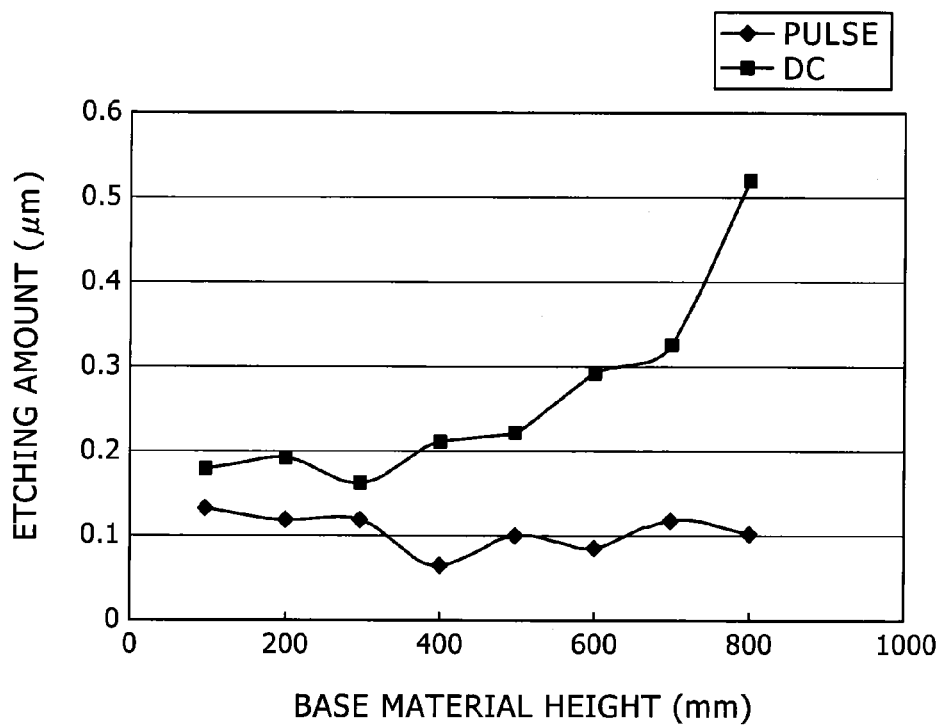
FIG. 3 A graph showing etching distribution in the base material height direction.

The bias power supply 12 in the ion bombardment treatment apparatus 1A according to the present embodiment is the DC power supply for applying the negative charge to the base materials W. However, the bias power supply is not limited to this but for example a pulse power supply may be adopted as the bias power supply 12. A case where the pulse power supply is used as the bias power supply 12 will be described below. FIG. 3 shows measurement results of an etching amount (cleaning amount) of the base materials W (test pieces). The measurement result of a case where a pulse wave current flows from the pulse power supply 12 through the base materials W (pulse mode) is shown by the marks ♦, and the measurement result of a case where the DC current flows from the DC power supply through the base materials W (DC mode) as a comparative example is shown by the marks ■. As measurement conditions, the pulse wave current of the pulse mode has bias voltage of 300 V, a frequency of 30 kHz, and a duty ratio of 62%. The base materials W are WC (tungsten carbide) test pieces. Eight test pieces are placed in the up and down direction, the argon gas pressure in the vacuum chamber 2 is 0.8 Pa, and the discharge current by the discharge power supply 5 is 30 A.

It should be noted that FIG. 3 also shows the result of the comparative example of a case where the DC current at the bias voltage of 300 V flows through the similar base materials W under the same argon gas pressure and discharge current. As shown in FIG. 3, in the measurement result of a case of the pulse mode, although the total etching amount (an amount of dirt removed by the cleaning treatment) is decreased in comparison to the measurement result of a case of the DC mode, etching distribution in the treatment height direction of the base materials W is substantially uniform around 0.1 μm.

This is because when the DC current flows as the bias voltage to the base materials W, the charged base materials W become potential barriers against the glow discharge between the filament 3 and the anode 4, so that unstable discharge is caused. However, by using the pulse power supply as the bias power supply 12, this unstable discharge is suppressed, so that the distribution of the etching amount of the base materials W by the ion bombardment treatment is improved.

It should be noted that since the discharge voltage is lowered after start of the glow discharge, automatic control is performed by adjusting the value of the current flowing through the filament 3 so as to obtain proper discharge voltage (so that potential of the filament 3 is always negative potential with respect to the vacuum chamber 2). In this case, the discharge voltage for sustaining the glow discharge and the argon gas pressure are lower than the start of the discharge.

Next, another embodiment will be described.

Second Embodiment

Figure 4:
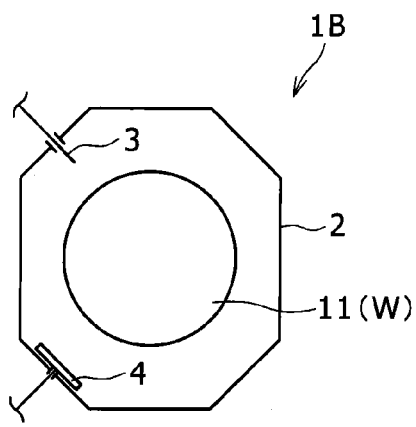
FIG. 4 A schematic view showing the planar direction of an ion bombardment apparatus according to a second embodiment.

FIG. 4 shows an ion bombardment treatment apparatus 1B according to a second embodiment. The ion bombardment treatment apparatus 1B of the second embodiment is similar to the ion bombardment treatment apparatus 1A of the first embodiment but different in terms of the following point. That is, in this ion bombardment treatment apparatus 1B of the second embodiment, the base materials W are not placed between the filament 3 and the anode 4 unlike the first embodiment but the filament 3 is placed closer to the anode 4 (at a position where the filament comes closer to the anode 4 than the position on the opposite side of the anode 4 across the base materials W). Thereby, in the ion bombardment treatment apparatus 1B of the second embodiment, an influence on the discharge between the filament 3 and the anode 4 by the base materials W and the work table 11 is suppressed (it should be noted that a space around the base materials W where plasma is generated is narrowed). In this case, since an area where the ion bombardment treatment can be performed is also narrowed, it is essential to rotate the work table 11 as well as the first embodiment.

Next, another embodiment will be described.

Third Embodiment

Figure 5:
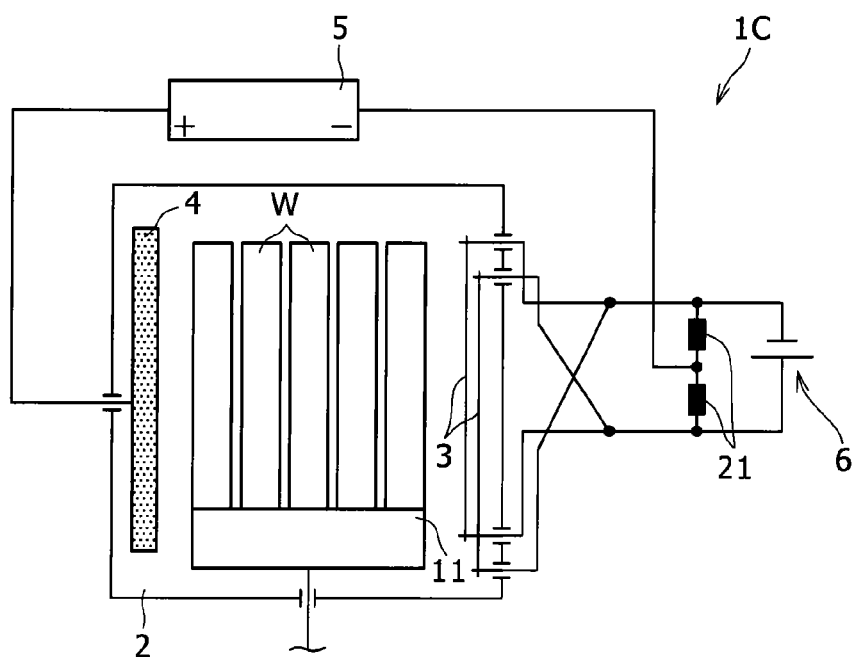
FIG. 5 A schematic view showing an ion bombardment apparatus according to a third embodiment.

FIG. 5 shows an ion bombardment apparatus 1C according to a third embodiment. The ion bombardment treatment apparatus 1C of the third embodiment is similar to the ion bombardment treatment apparatus 1A of the first embodiment but different in terms of the following point. That is, in this ion bombardment treatment apparatus 1C of the third embodiment, the filament heating power supply 6 is a DC power supply and two filaments 3 whose positive and negative electrodes are vertically opposite to each other are placed over the treatment height direction of the base materials W. Therefore, an amount of the thermal electrons to be emitted is gradually decreased from an end on the side where the potential is high to an end on the side where the potential is low in the filaments 3. However, since the filaments 3 supplement this gradually decreased emission amount for each other, an amount of the thermal electrons to be actually irradiated to the base materials W is uniform over the treatment height of the base materials W.

Further, since a potential change of the filaments 3 relative to the vacuum chamber 2 is eliminated, the discharge between the filaments 3 and the anode 4 is stabilized. It should be noted that this ion bombardment treatment apparatus 1C of the third embodiment is provided with a load resistance 21 as a circuit configuration to be connected to midpoint potential between the ends of the filaments 3 without a short circuit of the negative side output of the discharge power supply 5.

Next, another embodiment will be described.

Fourth Embodiment

Figure 6:
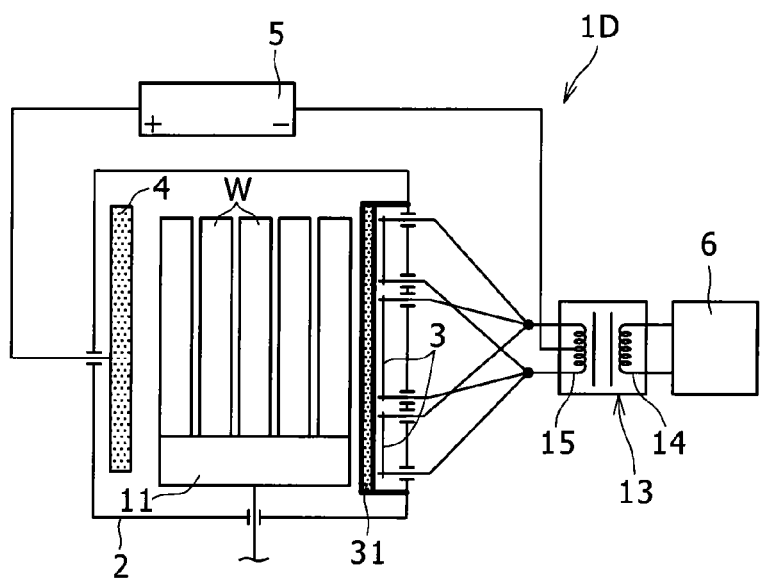
FIG. 6 A schematic view showing an ion bombardment apparatus according to a fourth embodiment.

FIG. 6 shows an ion bombardment treatment apparatus 1D according to a fourth embodiment of the present invention. The ion bombardment treatment apparatus 1D of the fourth embodiment is similar to the ion bombardment treatment apparatus 1A of the first embodiment but different in terms of the following point. That is, in this ion bombardment treatment apparatus 1D of the fourth embodiment, the thermal electron emission electrode is not formed by one filament 3 unlike the first embodiment but the thermal electron emission electrode is formed by a plurality of filaments 3 placed over the treatment height of the base materials W. By using the plurality of filaments 3 in such a way, disconnection of the filaments 3 is suppressed and a replacement task thereof is easily performed. In addition, the ion bombardment treatment apparatus 1D of the fourth embodiment is provided with a shutter 31 for covering the above filaments 3. By this shutter 31, attachment of dirt to the filaments 3 is prevented.

Thereby, the ion bombardment treatment apparatus 1D of the fourth embodiment can prevent that at the time of decreasing thermal electron emission efficiency of the filaments 3 themselves due to the attachment of the dirt or heating the filaments 3, the attached dirt is evaporated and attached (to contaminate) the surfaces of the base materials W or the like.

Next, another embodiment will be described.

Fifth Embodiment

Figure 7:
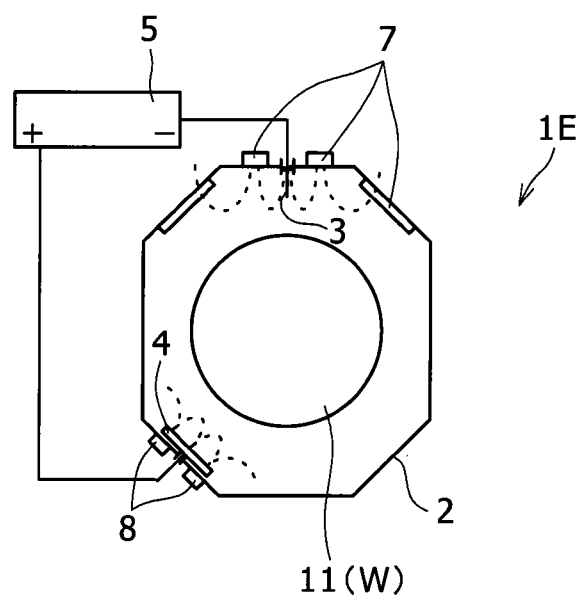
FIG. 7 A schematic view showing the planar direction of an ion bombardment apparatus according to a fifth embodiment.

FIG. 7 shows an ion bombardment treatment apparatus 1E according to a fifth embodiment. The ion bombardment treatment apparatus 1E of the fifth embodiment is similar to the ion bombardment treatment apparatus 1A of the first embodiment but different in terms of the following point. That is, in the ion bombardment apparatus 1E of the fifth embodiment, a first magnetic force generation means 7 forming a magnetic line from the filament 3 toward the base materials W is placed in the vicinity of the filament 3 in the vacuum chamber 2, and a second magnetic force generation means 8 forming a magnetic line from the anode 4 toward the base materials W is placed in the vicinity of the anode 4. These first and second magnetic force generation means 7, 8 are permanent magnets or electromagnetic coils which may be placed on an outer wall of the vacuum chamber 2 on the back (on the back surface side) of the filament 3 and the anode 4 or may be placed on the left and right sides of the filament 3 and the anode 4 on an inner wall of the vacuum chamber 2 (refer to the reference numerals 7, 8 in FIG. 7).

By adjusting placement of these first and second magnetic force generation means 7, 8 with respect to the filament 3 and the anode 4 and strength of the magnetic lines to be generated, a trajectory of the thermal electrons moved in the vacuum chamber 2 can be controlled, so that the discharge can be stably started and maintained. Further, a discharge current is increased, so that a cleaning time is shortened, and discharge ignition under a low-pressure gas atmosphere is easily performed.

It should be noted that although the ion bombardment treatment apparatus 1E is provided with both the first and second magnetic force generation means 7, 8 in the above description, the apparatus may have only one of the first magnetic force generation means 7 on the filament 3 side and the second magnetic force generation means 8 on the anode 4 side.

The embodiments disclosed herein are not a limitation but an example in all respects. The scope of the present invention is specified not by the above description but by the claims and intended to include equal meanings to the claims and all the changes within the claims.

For example, the ion bombardment treatment apparatus 1 is provided with the DC power supply dedicated for cleaning as the discharge power supply 5. However, a power supply used in a process other than cleaning of the base materials W (such as a drive power supply for the electromagnetic coils placed on the back of the arc evaporation source and an electron heating power supply) may also serve as the discharge power supply 5. The phase of the current flowing from the heating power supply 6 to the thermal electron emission electrode 3 is controlled by the power conditioner described above. However, pulse width modulation (PWM) control or the like may be performed. In this case, the potential change of the thermal electron emission electrode 3 relative to the vacuum chamber 2 can be flattened.

The switching circuit 16 described in the paragraph of the first embodiment can also be applied to the ion bombardment treatment apparatuses 1B to 1E of the second to fifth embodiments.

The present specification discloses various modes of techniques as described above. Among the techniques, major techniques will be summarized below.

An ion bombardment treatment apparatus according to one mode is an ion bombardment treatment apparatus for cleaning a surface of a base material placed in a vacuum chamber by irradiating gas ions generated in the vacuum chamber, including a heating type thermal electron emission electrode placed on one inner surface of the vacuum chamber and formed by a filament, an anode placed on another inner surface of the vacuum chamber, the anode for receiving a thermal electron from the thermal electron emission electrode, a base material holding tool for mounting the base material in such a manner that the base material is placed between the thermal electron emission electrode and the anode, a discharge power supply for generating a glow discharge upon application of a potential difference between the thermal electron emission electrode and the anode, a heating power supply for heating the thermal electron emission electrode so as to emit the thermal electron, and a bias power supply for applying negative potential with respect to the vacuum chamber to the base material, wherein the discharge power supply is insulated from the vacuum chamber, and the gas ions generated by the discharge power supply, the heating power supply, and the bias power supply are irradiated to the surface of the base material.

Since the base material is placed between the thermal electron emission electrode and the anode by the base material holding tool, plasma of the gas ions can be generated in the vicinity of the base material. Thereby, a cleaning effect of the base material can be enhanced. By wiring the discharge power supply while being insulated from the vacuum chamber, current control of the power supplies is stabilized.

In one of other modes, in the above ion bombardment treatment apparatus, the thermal electron emission electrode may include a plurality of filaments. In this case, disconnection of the filaments is suppressed and a replacement task is easily performed.

In one of other modes, in the above ion bombardment treatment apparatus, the heating power supply may be a DC power supply, and the plurality of filaments may include two filaments whose positive and negative electrodes are vertically opposite to each other. In this case, since the filaments supplement an emission amount for each other, an amount of the thermal electron to be actually irradiated to the base material is uniform over treatment height of the base material. Further, since a potential change of the filaments relative to the vacuum chamber is eliminated, the discharge between the filaments and the anode is stabilized.

In one of other modes, in the above ion bombardment treatment apparatuses, a first magnetic force generation portion forming a magnetic line from the thermal electron emission electrode toward the base material may be placed on the back or the side of the thermal electron emission electrode. In one of other modes, in the above ion bombardment treatment apparatuses, a second magnetic force generation portion forming a magnetic line from the anode toward the base material may be placed on the back or the side of the anode. Only this second magnetic force generation portion may be provided or the second magnetic force generation portion may be provided together with the first magnetic force generation portion. Thereby, by adjusting placement of the magnetic force generation portions and strength, a trajectory of the electron moved in the vacuum chamber can be controlled, so that the discharge can be stably started and maintained. Further, a discharge current is increased, so that a cleaning time is shortened, and discharge ignition under a low-pressure gas atmosphere is easily performed.

In one of other modes, in the above ion bombardment treatment apparatuses, a shutter for covering the thermal electron emission electrode may be placed in the vacuum chamber. Thereby, dirt is not attached to the thermal electron emission electrode. Thus, contamination of the base material due to evaporation of the attached dirt at the time of heating the filament and a decrease in thermal electron emission efficiency due to attachment of the dirt can be prevented.

In one of other modes, in the above ion bombardment treatment apparatuses, the bias power supply may be a pulse power supply. When negative bias voltage is applied to the base material, the application becomes a cause of unstable discharge between the thermal electron emission electrode and the anode. However, with the pulse bias power supply, the unstable discharge is suppressed, so that etching distribution of the base material is improved.

In one of other modes, in the above ion bombardment treatment apparatuses, a switching circuit for enabling to selectively connect a positive side output of the discharge power supply to one of the anode and the base material may be provided. In this case, by connecting the positive side output of the discharge power supply and the base material, the base material has higher potential (positive potential) than the filament. Thus, the ion bombardment treatment apparatus can also be used for electron heating use of irradiating the thermal electron emitted from the filament to the base material so as to heat the base material.

A method for cleaning according to one of other modes is a method for cleaning of a surface of a base material using the above ion bombardment treatment apparatuses, including the steps of increasing a heating current flowing through the thermal electron emission electrode and gas pressure of a gas atmosphere in the vacuum chamber until a glow discharge is started between the thermal electron emission electrode and the anode before a film is formed on the surface of the base material placed in the vacuum chamber, and lowering the gas pressure to a value with which the discharge is sustainable and adjusting the heating current after the glow discharge is started.

Thereby, a high-voltage power supply is not required as the discharge power supply, so that an occupied space and the cost can be suppressed.

This application is based on Japanese Patent Application No. 2010-125830 applied on Jun. 1, 2010, and contents thereof are included herein as a reference.

In order to express the present invention, the present invention is properly and fully described above through the embodiments with reference to the drawings. However, those skilled in the art should recognize that the above embodiments can be easily changed and/or modified. Therefore, unless a changed mode or a modified mode implemented by those skilled in the art is on a level departing from the scope of claims described in the claims, the changed mode or the modified mode is interpreted to be included in the scope of claims.

INDUSTRIAL APPLICABILITY

According to the present invention, the ion bombardment treatment apparatus and the method for cleaning of the surface of the base material using this treatment apparatus can be provided.

The invention claimed is:

1. An ion bombardment treatment apparatus for cleaning a surface of a base material placed in a vacuum chamber by irradiating gas ions generated in the vacuum chamber, comprising:
    a heating type thermal electron emission electrode placed on one inner surface of the vacuum chamber and formed by a filament;
    an anode placed on another inner surface of the vacuum chamber, the anode for receiving a thermal electron from said thermal electron emission electrode;
    a base material holding tool for holding the base material in such a manner that the base material is placed between said thermal electron emission electrode and said anode;
    a discharge power supply for generating a glow discharge upon application of a potential difference between said thermal electron emission electrode and said anode;
    a heating power supply for heating said thermal electron emission electrode so as to emit the thermal electron; and
    a bias power supply for applying negative potential with respect to the vacuum chamber to the base material, wherein
    said heating power supply is not connected to the vacuum chamber,
    the gas ions generated by said discharge power supply, said heating power supply, and said bias power supply are irradiated to the surface of the base material,
    said discharge power supply is not connected to said heating power supply and said discharge power supply is also not connected to the vacuum chamber.

2. The ion bombardment treatment apparatus according to claim 1, wherein said thermal electron emission electrode includes a plurality of filaments.

3. The ion bombardment treatment apparatus according to claim 2, wherein
    said heating power supply is a DC power supply, and
    the plurality of filaments includes two filaments whose positive and negative electrodes are vertically opposite to each other.

4. The ion bombardment treatment apparatus according to claim 1, further comprising:
    a first magnetic force generation portion placed on a back or a side of said thermal electron emission electrode, so as to form a magnetic line from said thermal electron emission electrode toward the base material.

5. The ion bombardment treatment apparatus according to claim 4, further comprising:
    a second magnetic force generation portion placed on a back or a side of said anode, so as to form a magnetic line from said anode toward the base material.

6. The ion bombardment treatment apparatus according to claim 1, further comprising:
    a second magnetic force generation portion placed on a back or a side of said anode, so as to form a magnetic line from said anode toward the base material.

7. The ion bombardment treatment apparatus according to claim 1, further comprising:
    a shutter placed in the vacuum chamber, the shutter for covering said thermal electron emission electrode.

8. The ion bombardment treatment apparatus according to claim 1, wherein said bias power supply is a pulse power supply.

9. The ion bombardment treatment apparatus according to claim 1, further comprising:
a switching circuit for enabling to selectively connect a positive side output of said discharge power supply to one of said anode and the base material.

10. The ion bombardment treatment apparatus according to claim 1, further comprising:
an insulating transformer for connecting said heating power supply to said thermal electron emission electrode in an electrically insulated state, wherein a negative side output of said discharge power supply is connected to said thermal electron emission electrode through a
secondary coil of said insulating transformer.

11. The ion bombardment treatment apparatus according to claim 1, wherein said discharge power supply and said heating power supply do not form a loop via said vacuum chamber or a common ground.

12. A method for cleaning of a surface of a base material before film formation using the ion bombardment treatment apparatus according to claim 1, comprising the steps of:
increasing a heating current flowing through said thermal electron emission electrode and gas pressure of a gas atmosphere in the vacuum chamber until a glow discharge is started between said thermal electron emission electrode and said anode; and
lowering the gas pressure to a value with which the discharge is sustainable and adjusting the heating current after the glow discharge is started.

* * * * *